March 8, 1966 G. W. NEFF ETAL 3,239,695

SEMICONDUCTOR TRIGGERS

Original Filed Feb. 8, 1960 3 Sheets-Sheet 1

INVENTORS
GORDON W. NEFF
HANNON S. YOURKE

BY Edward G. Fiorito
ATTORNEY

United States Patent Office 3,239,695
Patented Mar. 8, 1966

3,239,695
SEMICONDUCTOR TRIGGERS

Gordon W. Neff, Mahopac, and Hannon S. Yourke, Peekskill, N.Y., assignors to International Business Machines Corporation, Armonk, N.Y., a corporation of New York Continuation of application Ser. No. 7,414, Feb. 8, 1960. This application Dec. 28, 1964, Ser. No. 421,496
5 Claims. (Cl. 307—88.5)

This application is a continuation of co-pending application, Serial No. 7,414, filed February 8, 1960, now abandoned.

This invention relates to semiconductor trigger circuits, and more specifically to trigger circuits which employ the combination of an Esaki diode and a semiconductor to achieve latch type operation.

An article in the Physical Review for January 1958, on pages 603–604, entitled "New Phenomenon in Narrow Germanium P-N Junctions," by Leo Esaki, describes a semiconductor structure which has come to be known as an "Esaki diode," sometimes alternately referred to in the literature and herein as a "tunnel diode." As described by Esaki, this diode is a PN junction device in which the junction is very thin, i.e. narrow, in the currently accepted terminology, (on the order of 150 Angstrom units or less) and in which the semiconductor materials on both sides of the junction have high impurity concentrations (of the order of $10^{19}$ net donor or acceptor atoms per cubic centimeter for germanium).

The tunnel diode is characterized by a very low reverse impedance, approaching a short circuit, with a forward potential-current characteristic exhibiting a negative resistance region beginning at a small value of forward potential (of the order of 0.05 volt) and ending at a large forward potential (of the order of 0.2 volt). The potential value of the low potential end of the negative resistance region is very stable with respect to temperature and does not vary over a range of temperatures from a value near zero degrees K to several hundred degrees K. At potential values outside the limited range described above, forward resistance of the tunnel diode is positive. The tunnel diode is then considered to be a diode exhibiting an "n" type characteristic curve for a plot of current versus potential. For a more complete understanding of the structure and operational characteristics of the tunnel diode, reference is made to an article appearing in the Proceedings of the IRE, July 1959, pages 1201–1206, entitled "Tunnel Diodes as High Frequency Devices," by H. S. Sommers, Jr.

The "Esaki," or "tunnel" diode may then be said to be a P-N junction diode wherein both the P-region and the N-region contain a very high concentration of their respective impurities resulting in a current vs. voltage characteristic which exhibits a short circuit stable negative resistance region.

Heretofore, it has been shown that the tunnel diode may be biased properly to make it function bistably with the voltage difference between the two stable states employed to control operation of a device or load employed in conjunction with the tunnel diode. Loads which exhibit linear characteristics designed to achieve maximum current gain cause operation of the tunnel diode in its first region of positive resistance and the region of positive resistance beyond the negative resistance slope. It has been found that operation of the tunnel diode biased as set forth above causes, in some instances, erroneous switching behavior unless strict tolerance requirements are adhered to due to the slight variations in the current supply and small signal noise from an input line which may occur. Reducing the current supply in such instances serves to stabilize operation of the tunnel diode in the first positive resistance region but brings the operating point on the high voltage side closer to its switching threshold, therefore allowing the same type erroneous operations.

The above stated disadvantages are alleviated by construction of a circuit in accordance with the teachings of this invention. Employing a tunnel diode in a circuit coupled to a load which exhibits open circuit characteristics allows biasing of the diode with a small current supply to cause operation of the tunnel diode in a first and a second stable state wherein maximum tolerance for the switching threshold is achieved. Further, biasing the tunnel diode with a device exhibiting open circuit load characteristics provides a greater voltage swing between the two operating stable states of the Esaki allowing control of devices heretofore considered inapplicable for use therewith.

In a basic embodiment of this invention the inherent compatability of the tunnel diode loaded with a comparably high input resistance of a grounded emitter transistor is shown wherein the essentially open circuit load presented by the transistor to the tunnel diode when a current bias is applied results in bistable operation of the device. The two operating states of the transistor are nonconducting, i.e. cut off, and conducting, to the extent of saturation, providing a voltage output at the collector of the transistor. The circuit has power gain by use of the transistor, and when once selected, the state of the transistor is maintained by way of the binary memory of the tunnel diode. Thus, the operated state of the transistor switching element is dependent upon the stable state of the tunnel diode.

Other embodiments of this invention employing the basic principles set forth above demonstrate the ability of constructing trigger circuits wherein one tunnel diode is coupled to two transistors wherein the emitter electrodes of both transistors are commoned to an emitter current supply. Thus both the operating states of both the transistor switching elements are interdependently related to one another and dependently related to the state of the tunnel diode. To further demonstrate the versatility of this basic invention, another embodiment is disclosed wherein a number of transistors are connected to cause their operating states to be interdependently related, which transistors in turn are coupled to a number of tunnel diodes so as to cause the states of the transistors to be dependently related to the states of the tunnel diodes. To enhance a complete understanding of this invention and the novel manner in which this invention may be employed, a binary trigger circuit is constructed employing a gating circuit in combination with another embodiment of this invention.

Accordingly, a prime object of this invention is to provide operation of a current driven device exhibiting a short circuit negative resistance characteristic in a novel manner.

Another object of this invention is to provide a current driven device exhibiting a short circuit negative resistance characteristic coupled to a switching element which exhibits a substantially open circuit load to the device when operated in both a first and a second stable state.

Still another object of this invention is to provide novel circuitry employing the combination of a short circuit stable negative resistance device coupled to a device exhibiting a gain characteristic and a substantially open circuit load to said device.

Yet another object of this invention is to provide a novel circuit wherein a tunnel diode is coupled to a switching element wherein the state of the element is dependent upon the state of the diode and the element biases the diode to cause substantially similar current passage through the Esaki when operated in a first and a second stable state.

Another object of this invention is to provide novel circuitry employing a multiplicity of switching elements in combination with tunnel diodes wherein the operated states of the elements are interdependently related to one another and dependently related to the states of the diodes.

Another object of this invention is to provide novel semiconductor trigger circuits.

Still another object of this invention is to provide a novel binary trigger circuit.

Yet another object of this invention is to provide a novel binary trigger circuit employing a regeneration circuit.

Another object of this invention is to provide a novel binary trigger circuit wherein the state of the circuit is switched upon collapse of a predetermined input pulse.

The foregoing and other objects, features and advantages of the invention will be apparent from the following more particular description of preferred embodiments of the invention, as illustrated in the accompanying drawings.

Figure 1:
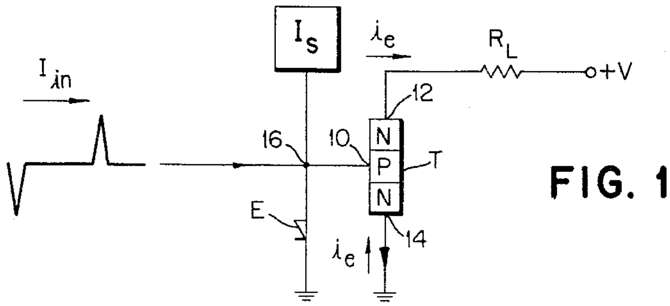
FIG. 1 illustrates a basic embodiment of this invention.

A basic embodiment of this invention is shown in FIG. 1. Referring to FIG. 1, a tunnel diode E is provided coupled to a transistor T having a base electrode 10, a collector electrode 12 and an emitter electrode 14. The collector electrode 14 is connected to a voltage +V through a resistor $R_L$. The base electrode 10 of the transistor $T_1$ is connected to a terminal 16 which is a junction with the tunnel diode E and a current source $I_S$ is provided for energizing the circuit and is connected to the terminal 16.

Figure 2:
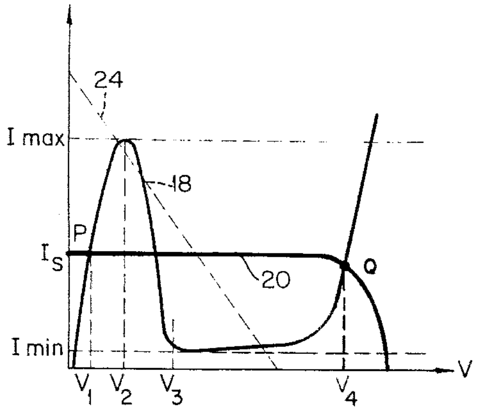
FIG. 2 illustrates the characteristic curve of a tunnel diode as employed in the embodiment of FIG. 1.

Referring to the FIG. 2, there is shown a voltage (V) versus current (I) plot for the diode E which exhibits a curve 18. In the FIG. 2, various voltages labelled $V_1$, $V_2$, $V_3$ and $V_4$ are shown and an open circuit load line, 20, is also shown which intersects the curve 18 at a point labelled P at the voltage $V_1$ and a point Q at the voltage $V_4$ when the current source $I_S$ is applied. The curve 18 of the FIG. 2 may be described as exhibiting a first region of positive resistance over a low range of potentials and adjoining at a peak value of current, labelled $I_{max}$ at the voltage $V_2$, a second region of negative resistance to a current value labelled $I_{min}$ at the voltage $V_3$, and thence a region of positive resistance. As shown by the load line 20, the characteristic of the diode E is open circuit bistable, and may be considered short circuit stable.

Figure 3:
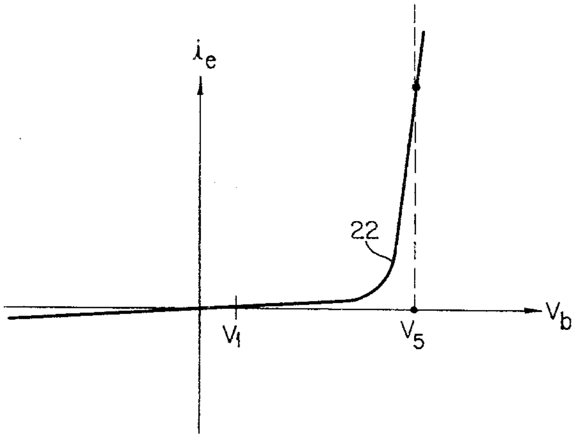
FIG. 3 illustrates the switching characteristics of a semiconductor switching element employed in the embodiment of FIG. 1.

Referring to the FIG. 3, a plot of emitter current, $i_e$ versus emitter to base voltage ($V_{eb}$) of the transistor T with the collector returned to +V through the resistor $R_L$ for the circuit of FIG. 1 is shown by a curve 22. A value of base voltage labelled $V_5$ results in an emitter-current which causes saturation of the transistor T, that is, a current through the collector 12, $i_c$, is equal to $\alpha i_e$ which produces a voltage drop across $R_L$ equal to +V, and therefore collector current $i_c$ becomes a maximum.

It is well known in the art that, when considering the junction formed between doped semiconductors of opposite impurity content, the applied potential necessary to overcome the potential barrier to carriers at the junction is directly proportional to the energy gap of the particular material used. Furthermore, there is a variety of semiconductor materials which are applicable for P-N junction devices and these materials differ from one another in the magnitude of their energy gaps. Therefore they differ in the amount of applied potential necessary to overcome the potential barriers of their respective P-N junctions.

The voltage difference between the two regions of positive resistance in the characteristic curve 18 for the tunnel diode E is similarly dependent on the semiconductor material of which it is constructed. Therefore, by employing a tunnel diode in a manner such that the voltage $V_4$ in FIG. 2 is equal to or greater than the voltage $V_5$ of FIG. 3, the Esaki is capable of biasing the transistor T into saturation. This assumes that the transistor produces the open circuit load characteristic 20. This assumption is valid, since tunnel diodes are available with maximum current adjacent to the negative resistance region ranging from several micro-amperes to several amperes, a tunnel diode is constructed such that the base current drawn by the transistor during conduction is a small fraction of the maximum diode current, and the current variation of the stable operating point Q of FIG. 2 will have a very small percentage change between the non-conduction and conduction, or saturation state, of transistor $T_1$.

Therefore, a circuit such as shown in the FIG. 1 is constructed such that when the tunned diode E is operating in the P state, the transistor will be cut off, and when diode E is operated in the Q state, the transistor T will be in saturation, with a corresponding collector voltage of approximately zero volts.

By employing a device exhibiting an open circuit load characteristic, as shown in FIG. 2 by the load line 20, a great reduction in tolerance problems is now possible. For example, if a load, exhibiting a characteristic defined by a dotted curve 24 in FIG. 2, were employed, a slightly variation in the current supply for such a load, or a small noise signal from the input line would switch the diode through its negative resistance region from the low voltage region to the high voltage region. This condition may be alleviated by reducing the current bias on the Esaki, but in so doing, the stable operating point on the high voltage side of the negative resistance region is brought closer to its switching threshold and again power supply variation or noise signals would cause erroneous switching. In the case of the load line 20 of FIG. 2, maximum noise rejection and allowable tolerance variations is achieved and the above stated disadvantages removed. Because of the orientation of the open circuit load line, the voltage difference between the P and Q operating states is a maximum, thus providing voltage change for controlling the state of T. This advantageous in that tunnel diodes and transistors of the same semiconductor material may be employed together. For example, for a germanium drift transistor, the emitter to base potential drop, when the transistor is conducting approximately 6 ma. in the emitter, ranges from .22 v. to .32 v.

For presently available germanium tunnel diodes, the voltages at the two thresholds of the negative resistance region, $V_2$ and $V_3$ in FIG. 2 are approximately .05 v. and .25 v. so that operation near these points would produce insufficient change to operate the above mentioned transistor. However, by using the open circuit load line, the voltages corresponding to $V_1$ and $V_4$ in FIG. 2 are approximately .03 v. and .45 v. which make it possible to use germanium tunnel diodes and germanium transistors together.

The above described load condition results in zero current gain from the tunnel diode, however the necessary gain for the circuit is supplied by the transistor and the role of the tunnel diode is to provide memory and to allow the previously mentioned tolerances and noise levels.

Referring again to the circuit of FIG. 1 with the circuit energized by the source $I_S$, and the diode E in the P stable operating state the transistor T is in the non-conducting state. With an input, $I_{in}$, directed to the terminal 16 of positive polarity, the magnitude of which is equal to or greater than the value $(I_{max}-I_S)$ as shown in FIG. 2, the operating point of the tunnel diode E and consequently the circuit is forced toward the negative resistance region, at which point the diode E switches and the circuit goes to the Q stable operating point. Switching of the diode E causes the voltage $V_4$ to be impressed across the emitter-base electrodes, 14–10, of the transistor T. Since the voltage $V_4$ is equal to, or greater than the voltage $V_5$ in the FIG. 3, the transistor T is switched into the saturation state. If the input current remains, the operating point will be above point Q by an amount equal to the magnitude of the input current. However, as the transistor is saturated, this will not effect its output. Therefore the collector output of T will be constant, regardless of whether the input remains or terminates. With the circuit operating in the Q state if a negative current input pulse, $I_{in}$, is applied to terminal 16 which is capable of reducing the current through the Esaki to the value $I_{min}$ or less, the diode switches back to the low voltage region and the transistor is switched to the non-conductive state. Again, cut off of the transistor T occurs regardless of whether or not the negative current input is terminated.

Figure 4:
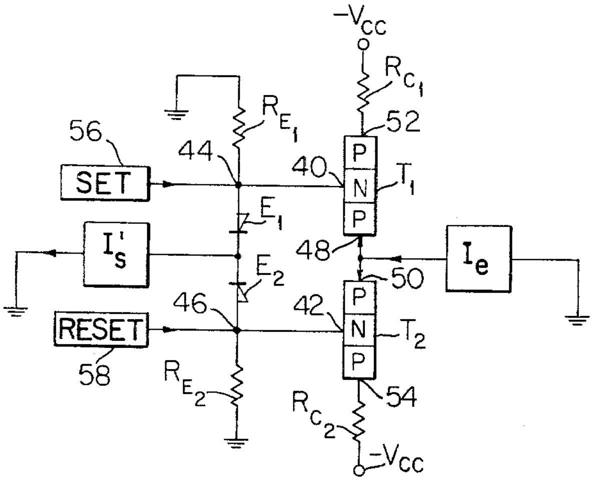
FIG. 4 illustrates another embodiment of this invention.

Referring now to the circuit of FIG. 4, a high-speed complementary set-reset trigger is shown employing the basic principles set forth in the embodiment of FIG. 1, which circuit is capable of operating at a high repetition rate (>10 mc.). For clarity and ease of understanding, in some instances the reference characters employed in the circuit of FIG. 1 are also employed in the circuit of FIG. 4 since their function and operation in the circuits are similar. Referring specifically to the trigger circuit of FIG. 4, a pair of tunnel diodes $E_1$ and $E_2$ are provided which are D.C. biased by a source $I_S'$ and a pair of resistors $R_{E1}$ and $R_{E2}$. The circuit is so designed that the circuit $I_S$ splits between the resistors $R_{E1}$ and $R_{E2}$ such that $I_S/2$ flows through each tunnel diode $E_1$ and $E_2$. A pair of PNP transistors $T_1$ and $T_2$ are provided having a base electrode 40 and 42, respectively, connected to a pair of terminals 44 and 46, respectively. The transistors $T_1$ and $T_2$ are also provided with an emitter electrode 48 and 50, and a collector electrode 52 and 54, respectively. The collector electrodes 52 and 54 are each connected to a source $-V_{cc}$ through a pair of collector resistors $R_{c1}$ and $R_{c2}$, respectively. The emitters 48 and 50 of the transistors $T_1$ and $T_2$, respectively, are commoned to a source of emitter current $I_e$. A source 56 is provided connected to the terminal 44 of the trigger which is adapted to "set" the trigger, while a source 58 is provided connected to the terminal 16 which is adapted to "reset" the trigger.

Figure 5:
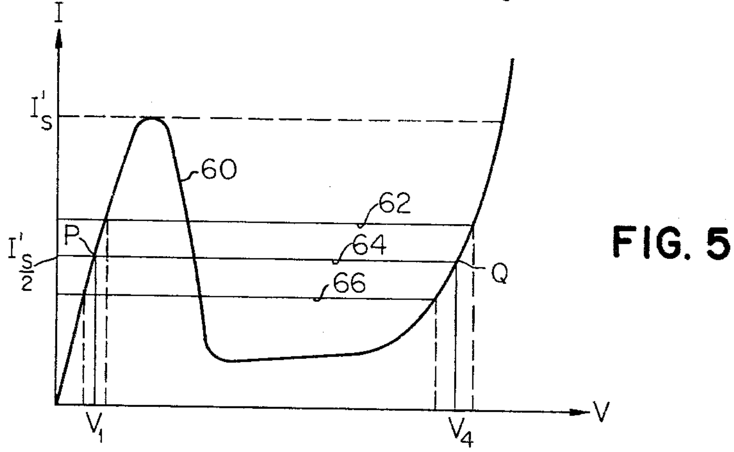
FIG. 5 illustrates the tunnel diode characteristics as employed in the embodiment of FIG. 4.

Referring to the FIG. 5, a plot of current versus potential for the tunnel diodes $E_1$ and $E_2$ of the FIG. 4 is shown. A curve 60 illustrates the characteristic curve for each of the tunnel diodes E and depicts a current driven "n" type characteristic curve. A number of load lines 62, 64 and 66 are shown depicting the different load characteristics to the tunnel diode $E_1$ and $E_2$ which characteristics are shown with the assumption that the transistors $T_1$ and $T_2$ present no load. As may be seen, the line 64 intersects the curve 60 at points P and Q designating two stable operating states of the tunnel diodes E at voltage values $V_1$ and $V_4$, and is similar to the plot shown in the FIG. 2.

Referring again to the FIG. 4, assume that the diode $E_1$ is operating at the Q stable state and the diode $E_2$ is operating at the P stable state. In this condition, the base 42 of T2 is more negative that the base 40 of $T_1$ by an amount $(V_4-V_1)$. The tunnel diodes E are chosen such that $(V_4-V_1)$ is greater than the emitter-base drop of either transistor in accordance with the principles set forth above. Therefore, $T_2$ conducts while $T_1$ remains non-conductive. For ease of explanation whenever a transistor is rendered conductive the state will be referred to as "On" while "Off" refers to the non-conductive state. The resistors $R_{E1}$ and $R_{E2}$ are large enough so that the difference in current through $E_1$ and $E_2$, due to the differences in voltage across $E_1$ and $E_2$ is small. This operation is shown in the FIG. 5 by the different load lines 62 and 66. As labelled, the load line 62 depicts operation of the tunnel diode $E_1$ or $E_2$ which is operating in the P stable state while the load line 66 depicts operation of the tunnel diode $E_1$ or $E_2$ which is operating in the Q stable state; therefore, both diodes $E_1$ and $E_2$ remain in their bistable region of operation.

If, in the FIG. 4, the source 58 provides a current pulse having an amplitude of $I_S$ or greater, this current splits between $R_{E1}$ and $R_{E2}$. Accordingly, a current $I_S'$ or greater will flow through the diode $E_2$, switching the diode $E_2$ to the Q stable operating state while the diode $E_1$ is switched to the P stable operating state rendering the transistor $T_1$ conductive, "On" and the transistor $T_2$ is non-conductive; "Off." With the trigger in the reset condition, if the source 56 is activated to provide a current pulse to the terminal 44 which is of a magnitude $I_S'$ or greater, again this current splits between resistors $R_{E1}$ and $R_{E2}$ providing a current $I_s$ or greater through $E_1$ to switch the diode $E_1$ from the P to the Q stable state while simultaneously switching the diode $E_2$ from the Q to the P stable state to render the transistors $T_2$ "On" and $T_1$ "Off."

It may be seen that if, with the trigger in one of the two conditions, "set" or "reset," a current pulse is applied by the source 56 while the trigger is in the set condition or by the source 58 when the trigger is in the reset condition, the diode $E_1$ or $E_2$, respectively, is driven further into the Q state while the other is driven further into the P state. Thus the state of the trigger remains unchanged. If the trigger circuit of FIG. 4 is "set" and operating in this condition; the transistor $T_2$ is "On" while $T_1$ is "Off"; and a negative current is applied to the terminal 44 by the source 56, the state of the trigger will change to the "reset" state. Again, such a current has the magnitude $I_S'$ or greater, and splits between the resistors $R_{E1}$ and $R_{E2}$. The negative current acts to provide increased current through the diode $E_2$ which switches the diode $E_2$ from the P to the Q stable state while switching the diode $E_1$ from the Q to the P stable operating state. Similarly, a negative current pulse applied to the terminal 46 by the source 58 while the trigger circuit is in the "reset" operating state will "set" the trigger. Thus, either positive or negative current inputs may be employed.

It should be noted that it is the difference in voltage across the tunnel diodes $E_1$ and $E_2$ that determines which of the transistors $T_1$ or $T_2$ is turned "On." Therefore, the trigger will function equally well if $E_1$ and $E_2$ are both reversed in the circuit, with a corresponding reversal of the source $I_S'$. Further, NPN type transistors may be employed instead of PNP type with equally satisfactory operation.

Figure 6:
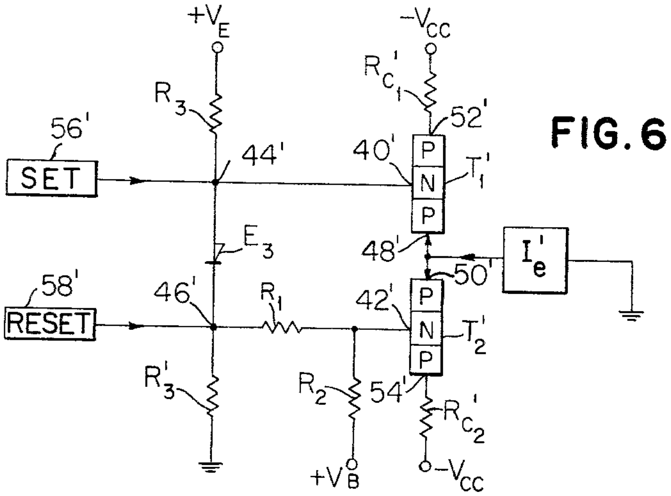
FIG. 6 illustrates still another embodiment of this invention.

Referring to the FIG. 6, another embodiment of a set-reset trigger is shown wherein a pair of PNP transistors $T_1'$ and $T_2'$ each having a base electrode 40' and 42', an emitter electrode 48' and 50', and a collector electrode 52' and 54', respectively, are provided with the emitter electrodes 48' and 50' connected to an emitter current supply $I_e'$. The collector electrodes 52' and 54' of $T_2'$ and $T_1'$, respectively, are both connected to a source $-V_{cc}'$ through resistors $R_{c1}'$ and $R_{c2}'$, respectively. The base 40' of $T_1'$ is connected to a terminal 44' while the base 42' of $T_2'$ is connected to a terminal 46' through a resistor $R_1$. A voltage supply $+V_B$ is provided connected intermediate the base 42' of $T_2'$ and $R_1$ through a resistor $R_2$. A source 56' is connected to the terminal 44' while a source 58' is connected to the terminal 46'' which functions to provide current inputs when actuated, of a magnitude $I_s'$ as indicated in the FIG. 5. The sources 56' and 58' function to provide "set" and "reset" action for the trigger circuit. Also provided in the circuit is a pair of resistors $R_3$ and $R_3'$ each having one end connected to the terminals 44' and 46', respectively. The other end of resistor $R_3'$ is grounded while the other end of $R_3$ is connected to a source $+V_E$. Connected intermediate the terminals 44' and 46' is a tunnel diode $E_3$ which is normally biased to the P stable state, as shown in the FIG. 2 by the source $+V_E$ and resistors $R_3$ and $R_3'$, such that $$\frac{+V_E}{R_3+R_3'}=\frac{I_S}{2}$$

The resistors $R_1$ and $R_2$ in combination with $+V_B$ biases the transistor $T_2'$ non-conductive, or "Off," with respect to the base electrode of $T_1'$, when the diode $E_3$ is in the P stable state.

Since the diode $E_3$ is normally operative in the P stable state while the base 42' is biased positive, the base 40' of $T_1$ is negative with respect to the base of $T_2'$ and thus allows conduction of $T_1'$. To provide this type of biasing, with the diode $E_3$ operating in the P stable state, the voltage drop across $R_1$ must be greater than the voltage $V_1$ across the diode $E_3$. Upon operation of the source 56', an impulse having a magnitude $I_s$ is applied to the terminal 44' which splits between the resistors $R_3$ and $R_3'$ to switch the diode $E_3$ to the Q stable state. The voltage change $(V_4-V_1)$ is sufficient to overcome the bias on $T_2'$ by an amount greater than the emitter-base drop of transistors $T_1'$ and $T_2'$ and consequently, $T_1'$ becomes non-conductive, i.e. is turned "Off," while $T_2'$ is made conductive, is turned "On."

With the diode $E_3$ in the Q stable operating state, if the source 58' is actuated to provide a current impulse of magnitude $I_S$, the diode $E_3$ is switched back to the P stable operating state to turn $T_1'$ "On" and $T_2'$ "Off."

As in the embodiment of FIG. 4, the circuit of FIG. 6 is adapted to work equally as well with negative current inputs from sources 56' and 58' or with alternate positive and negative current from either input source. As was the case in the FIG. 4, the diode $E_3$ may be reversed in the circuit with a similar reversal of the biasing voltage $V_E$. In this instance the source $V_B$ must also be reversed in polarity such that $T_2'$ is biased "On" while $T_1'$ is biased "Off." Again, the diode $E_3$ is required to provide a voltage difference between the P and Q states equal to or greater than twice the emitter-base voltage drop of $T_1'$ and $T_2'$. For presently available germanium transistors, the tunnel diode $E_3$ may be made of material having about twice the energy gap of germanium to provide this voltage difference.

In both embodiments of FIGS. 1 and 3, a high-speed operation is manifested due to the very short switching time of the tunnel diode. The tunnel diode follows the input pulses only from their D.C. bias point to the negative resistance region and once this region is reached, the diode switches with the speed which is characteristic of tunnel diodes while the change of state of the trigger circuit is a function of the switching characteristics of the transistors used.

Figure 7:
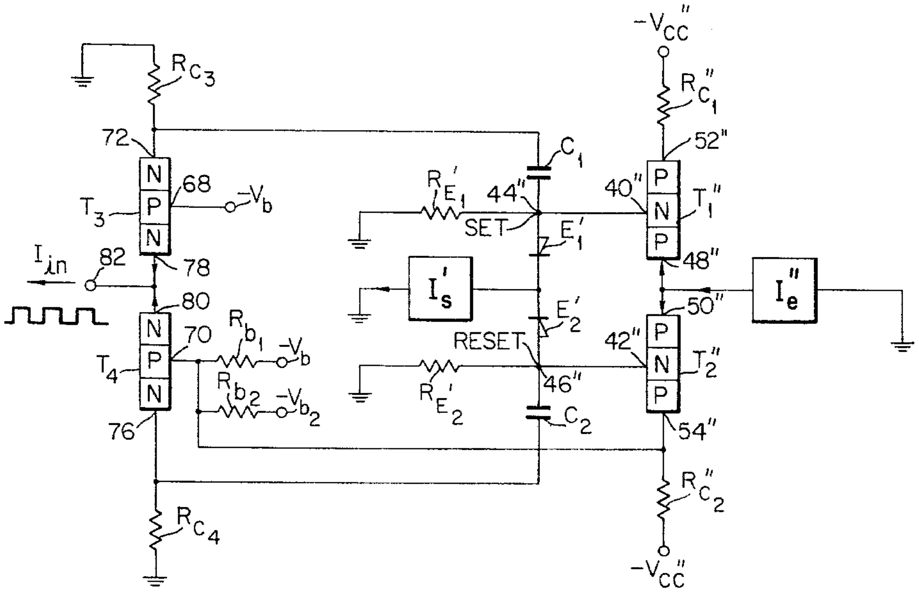
FIG. 7 illustrates yet another embodiment of this invention.

The trigger circuits described above may be employed to construct binary trigger circuits. One such binary trigger is shown in the embodiment of FIG. 7. Referring to the FIG. 7, the trigger circuit of FIG. 4 is employed with the same reference characters and numerals utilized for clarity and ease of understanding. In combination with the circuit of FIG. 4, there is provided in the circuit of FIG. 7 a pair of NPN transistors $T_3$ and $T_4$ each having a base electrode 68 and 70, a collector electrode 72 and 76, and an emitter electrode 78 and 80, respectively. The emitter electrodes 78 and 80 of $T_3$ and $T_4$, respectively, are connected to an input terminal 82 to which input signals $I_{in}$ are applied. The collector electrodes 72 and 76 of $T_3$ and $T_4$ are connected to grounded resistors $R_{C3}$ and $R_{C4}$ and to terminals 44'' and 46'' through a pair of capacitors $C_1$ abnd $C_2$, respectively. The base electrode 68 of $T_3$ is connected to a bias source $-V_{B1}$ while the base electrode 80 of $T_4$ is connected to the collector 54'' of $T_2''$. The base 70 of $T_4$ is also biased by the source $-V_{B1}$ through a resistor $R_{B1}$ and is further biased by a source $-V_{B2}$ through a resistor $R_{B2}$, where $-V_{B2}$ is more negative than $-V_{B1}$.

Operation of the circuit of FIG. 7 may best be considered when the terminal 82 is not energized. Assume initially that $E_1'$ is operating in the Q stable state while $E_2'$ is operating in the P stable state. Under these conditions, as described above, $T_2''$ is "On" while $T_1''$ is "Off." With $T_2$ "On" the base 70 of $T_4$ is biased "On" since it is now more positive than the base 68 of $T_3$, but since there is no emitter current, i.e. no input to 82, $T_4$ cannot conduct. A similar condition exists when the stable states of $E_1$ and $E_2$ are reversed and $T_1''$ is "On." At this time, $R_{B1}$ and $R_{B2}$ bias $T_4$ "Off" with respect to $T_3$.

Figure 8:
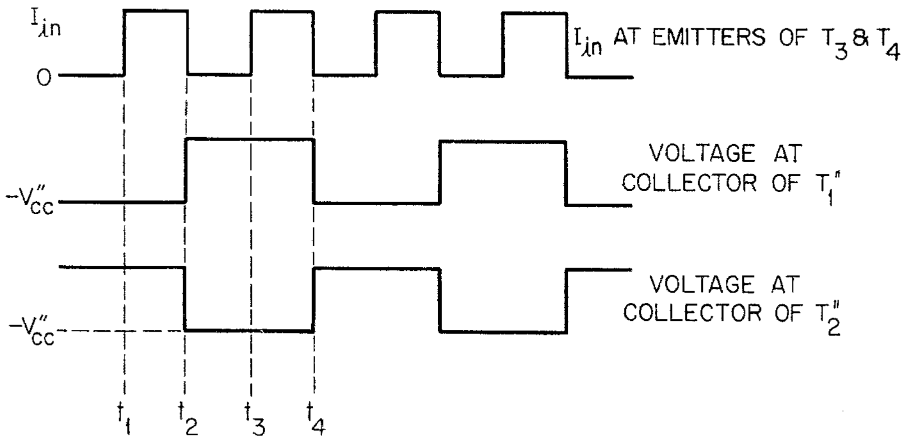
FIG. 8 illustrates a timing sequence of input signals and outputs derived in operating the embodiment shown in the FIG. 8.

In considering operation of the circuit of FIG. 7 with input pulses directed to the terminal 82, reference is made to the FIG. 8. In the FIG. 8, a continuous series of input pulses are shown labelled $I_{in}$, which are directed in the emitters 78 and 80 of the transistors $T_3$ and $T_4$, respectively. In timing relationship with the input $I_{in}$, a voltage pattern appearing at the collector 52'' of $T_1''$, which may be obtained across the resistor $R_{C1}''$, and a voltage pattern appearing at the collector 54'' of $T_2''$, obtained across the resistor $R_{C2}''$, is shown. It should be noted that the voltages appearing across the resistors $R_{C1}''$ and $R_{C2}''$ are complementary in form and that a change is shown to take place after the receipt of two input pulses, thus providing a binary or scale of two outputs with respect to the input pulses.

Referring again to the circuit of FIG. 7 and the associated FIG. 8, at a time $t_1$, the input terminal 82 of the circuit is energized by an input pulse $I_{in}$, which is of a magnitude sufficient to cause conduction of the transistors $T_3$ and $T_4$, therefore one or the other transistor $T_3$ or $T_4$ will conduct, depending upon the state of $T_2''$.

When the circuit of FIG. 7 is in the "set" condition; $E_1'$ operating in the Q stable state; $E_2'$ operating in the P stable state; $T_1''$ "Off" and $T_2''$ "On," with the input pulse $I_{in}$ energizing input terminal 82, the output of $T_2''$ biases the base 70 of $T_4$ positive with respect to the base 68 of $T_3$, turning $T_4$ "On." Conduction of $T_4$ charges the capacitor $C_2$ causing a transient current flow of negative polarity to the terminal 46''. This transient current has the same effect as a positive current impulse from the source 56 in the FIG. 3, and thus the state of the circuit remains unchanged. At a time $t_2$ when the input pulse $I_{in}$ goes to zero, the capacitor $C_2$ discharges to provide a current of positive polarity into the terminal 46'', which switches the state of $E_2'$ to the Q stable operating state, the diode $E_1'$ to the P state, turning the transistor $T_2''$ "Off" and transistor $T_1''$ "On." With $T_2''$ "Off", $T_3$ is now conditioned to conduct, but conduction cannot take place since $I_{in}$ is zero. At a time $t_3$, the next input impulse $I_{in}$ to input terminal 82 causes $T_3$ to conduct and in so doing charges the capacitor $C_1$ causing a transient impulse of negative polarity to be impressed on the terminal 44″. This transient impulse is equivalent to a positive impulse to the terminal 46″, having no effect as described above for the embodiment of FIG. 4. At a time $t_4$ when the pulse $I_{in}$ terminates, the capacitor $C_1$ discharges to provide a positive impulse to the terminal 44″ switching the diode $E_1'$ to the Q stable state, $E_2'$ to the P stable state, which in turn switches $T_1''$ "Off" and $T_2''$ "On."

Thus, the transistors $T_3$ and $T_4$ are utilized to provide binary gating of input pulses to the terminal 82 and alternately switch the tunnel diodes $E_1'$ and $E_2'$ between their stable operating conditions P and Q turning the transistors $T_1''$ and $T_2''$ "On" and "Off." The gating circuit is influenced by the previous state of the set-reset trigger such as to produce the required binary or scale of two gating of the input wave train at 82.

In order to aid in understanding and practicing the invention and to provide a starting place for one skilled in the art in the fabrication of the circuits of the invention the following sets of specifications for different embodiments of the invention are provided. It should be understood, however, that no limitation should be construed since other component values may be employed with satisfactory operation.

In each of the embodiments the transistors $T$–$T_4$ may be germanium drift transistors having an $\alpha$ cut-off in the range of 70 megacycles. The diodes $E$–$E_2$ may exhibit a maximum current adjacent the negative resistance region of 3 milliamperes, at a voltage of 0.07 volt; a minimum current adjacent the negative resistance region of 0.3 milliampere, at a voltage of 0.3 volt; and at 1.5 milliamperes, voltages in the positive resistance regions may be 0.025 volt defining the P stable state, and 0.47 volt, defining the Q stable state. The emitter current $I_e$ may have the value 6.6 milliamperes while the source $I_S$ may provide a bias of 3 milliamperes. The resistors $R_{E1}$ and $R_{E2}$ may have a value of 1300 ohms, while the resistors $R_{C1}$ and $R_{C2}$ may have a value of 270 ohms with the voltage $V_{cc}$ having a value of −6 volts. In the embodiment of FIG. 7, the voltage $-V_b$ may have a value of −6 volts and $V_{b2}$ a value of −12 volts while the resistor $R_{b1}$ is of 250 ohms and $R_{B2}$ of 2500 ohms. The resistors $R_{C3}$ and $R_{C4}$ may have a value of 680 ohms while the input current pulses to the emitters of $T_3$ and $T_4$ have a magnitude of 6 milliamperes, and the capacitors $C_1$ and $C_2$ may each have value of 68 micro-micro-farads.

Although, in each of the embodiments described above, an open circuit load line is illustrated in describing the circuit operation, it should be understood that once the tunned diode is switched from the P to the Q stable state, the load line would show a slight dip towards the voltage axis V shown in FIG. 2 rather than the straight line relationship and thus what is really presented to the tunnel diode is a substantially open circuit load when operating in both the P and Q stable states. Further, although transistors have been employed exclusively as devices which may be controlled, this does not infer that other devices could not as well be employed. An example of a second device applicable to the mode of operation discussed would be a field effect device which, as required, presents a high resistance load to the tunnel diode and is a voltage controlled device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In combination, a tunnel diode capable of being biased for operation in a first and a second stable state, a transistor having a base, collector and emitter electrodes, biasing means for operating said transistor in a non-conductive and a saturated state, means connecting said diode in parallel with the base and emitter electrodes of said transistor, and a constant current source joined to the connection of said diode with the base electrode of said transistor to cause the current passed through said tunnel diode when operating in both said first and second stable states to be similar when said transistor is operated in both the non-conductive and saturated states.

2. An apparatus comprising, a first and a second current driven device exhibiting a short circuit stable negative resistance characteristic each adapted to be operated in a first and a second stable state, a first and a second switching element adapted to be operated in a conductive and a non-conductive state, means for energizing both of said first and second devices to establish one of said devices in the first stable operating state and the other of said devices in the second stable operating state, and means interconnecting said devices and elements to cause the operating states of both of said elements to be interdependently related to one another and dependently related to the operating stable states of both of said devices and both said elements to exhibit a substantially open circuit load to both said devices when operated in the conductive and nonconductive state.

3. A binary trigger circuit comprising a first and a second tunnel diode, each adapted to be operated in a first and a second stable state, a first and a second transistor, each having a base, a collector and an emitter electrode, each said transistor adapted to be operated in a conductive and a non-conductive state, means connecting the emitter electrode of said first transistor to the emitter electrode of said second transistor so that the states of said transistors are interdependently related and further connecting the base electrode of the first transistor to the first diode and the base electrode of the second transistor to the second diode so that the states of both said transistors are dependently related upon the stable operating states of both said devices and that the current passed through both said diodes when operating in both said first and second stable states is substantially similar.

4. A trigger circuit comprising, a first and a second tunnel diode each having a first and a second terminal; a common constant current supply coupled to the first terminals of said diodes to provide a constant current bias; a first and a second transistor each including a base and emitter electrode, the base electrode of said first transistor being connected to the second terminal of said first tunnel diode and the base electrode of said second transistor being connected to the second terminal of said second tunnel diode; a second constant current supply connected to the emitter electrodes of said first and second transistors so that conduction of current in said first and second transistors is interdependently related and a substantially open circuit load is presented to said tunnel diodes for the entire conductivity range of said first and second transistors; a third and fourth transistor having base emitter and collector electrodes, the collector electrodes of said third and fourth transistors being coupled to the second terminals of said first and second tunnel diodes respectively and the base electrode of said fourth transistor being coupled to the collector of said second transistor; input means connected to the emitter electrodes of said third and fourth transistors, whereby the sequential application of input pulses to the emitter electrodes of said third and fourth transistors alternately turns one of said tunnel diodes on and the other tunnel diode off.

5. A tunnel diode circuit including a substantially constant current source, two similar branches connected in parallel thereacross, each branch comprising a tunnel diode and a resistor connected in series, and each branch having a low impedance state and a high impedance state, means for applying an input signal to the circuit to cause one or the other of the branches to be switched to the high impedance state, biasing means, a pair of transistors each having a base, a collector, and an emitter electrode, the collector and emitter electrodes of said transistors being connected to said biasing means to place said transistors in parallel thereacross, and means connecting the base electrode of each transistor to a different one of the two junctions between the tunnel diodes and the respective resistances.

References Cited by the Examiner

UNITED STATES PATENTS

| | | | |
|---|---|---|---|
| 2,614,142 | 10/1952 | Edson | 307—88.5 X |
| 2,944,164 | 7/1960 | Odell et al. | 307—88.5 |
| 3,109,945 | 11/1963 | Riley | 307—88.5 |
| 3,127,574 | 3/1964 | Sommers | 307—88.5 X |

ARTHUR GAUSS, *Primary Examiner.*